(12) United States Patent
Hirakawa et al.

(10) Patent No.: US 7,816,931 B2
(45) Date of Patent: Oct. 19, 2010

(54) CONTACT FOR ELECTRICAL TEST, ELECTRICAL CONNECTING APPARATUS USING IT, AND METHOD OF PRODUCING THE CONTACT

(75) Inventors: Hideki Hirakawa, Hirosaki (JP); Takayuki Hayashizaki, Hirakawa (JP); Akira Soma, Hirakawa (JP); Yuko Yamada, Owanimachi (JP)

(73) Assignee: Kabushiki Kaisha Nihon Micronics, Musahino-shi, Tokyo (JP)

( * ) Notice: Subject to any disclaimer, the term of this patent is extended or adjusted under 35 U.S.C. 154(b) by 6 days.

(21) Appl. No.: 12/388,394

(22) Filed: Feb. 18, 2009

(65) Prior Publication Data
US 2009/0230982 A1    Sep. 17, 2009

(30) Foreign Application Priority Data
Mar. 11, 2008    (JP) .............................. 2008-060927

(51) Int. Cl.
G01R 31/02    (2006.01)
(52) U.S. Cl. ...................................... 324/754
(58) Field of Classification Search ................. 324/754; 439/884; 29/874
See application file for complete search history.

(56) References Cited

U.S. PATENT DOCUMENTS
2008/0074128 A1 * 3/2008 Hirakawa et al. ............ 324/754

FOREIGN PATENT DOCUMENTS
JP    2002-005957    1/2002
WO    WO 2006/095441 A1    9/2006

* cited by examiner

*Primary Examiner*—Michael Cleveland
*Assistant Examiner*—Tabassom Tadayyon Eslami
(74) *Attorney, Agent, or Firm*—Ingrassia Fisher & Lorenz, P.C.

(57) ABSTRACT

A contact comprises a contact body at least provided with an arm region extending in the right-left direction, and a tip region extending downward from the front end portion of the arm region. The tip region is provided with a pedestal portion integrally continuous to the lower edge portion on the front end side of the arm region, and a contact portion projecting downward from the lower end portion of the pedestal portion and having a tip to be brought into contact with an electrode of a device under test at the lower end. The pedestal portion includes an underside region having at least four inclined faces located around the contact portion when the tip region is seen from below, and inclined such that a portion closer to the side of the contact portion becomes lower.

2 Claims, 7 Drawing Sheets

CONTACT FOR ELECTRICAL TEST, ELECTRICAL CONNECTING APPARATUS USING IT, AND METHOD OF PRODUCING THE CONTACT

TECHNICAL FIELD

The present invention relates to a contact for use in an electrical test of an integrated circuit, an electrical connecting apparatus using the same, and a method of producing the contact.

BACKGROUND ART

A semiconductor integrated circuit as a flat plate-like device under test is subjected to an electrical test as to whether it is produced as per specifications. The electrical test of this type is conducted by using an electrical connecting apparatus provided with a probe card having a plurality of contacts (i.e., probes) to be individually pressed against electrodes of the integrated circuit, a probe block, a probe unit and the like. The electrical test of this type is used for electrically connecting the electrodes of the device under test and testers.

There is one of such contacts used in the electrical connecting apparatus of this type which is shaped like a plate and a crank by using photolithography technology, deposition technology and the like (Patent Literature 1).

The contact comprises a first and a second arm portions extending in the right-left direction at vertical intervals, a first and a second coupling portions respectively coupling the first and second arm portions at their front end and rear end portions, a tip portion continuous to the lower side of the first coupling portion, and a mounting portion continuous to the upper side of the second coupling portion.

The first and second arm portions act as an arm region together with the first and second coupling portions. On the other hand, the tip portion acts as a tip region. The tip portion includes a pedestal portion integrally continuous to the lower edge portion on the front end side of the arm region, and a contact portion projecting downward from the lower end of the pedestal portion and having at the lower end a tip to be brought into contact with an electrode of the device under test at time of testing.

A conventional contact is cantilevered at its mounting portion on an adequate support base plate such as a wiring board or a probe board with solder or bond and assembled into an electrical connecting apparatus.

In a state that the electrical connecting apparatus is assembled into the tester, a plurality of contacts of the electrical connecting apparatus are illuminated from the tip side (the side of the device under test), and filmed by an area sensor like a CCD camera from the tip side. An output signal of the area sensor undergoes image processing to obtain the tip positions relative to the device under test (particularly, the electrodes) or the tester, and is used for positioning to determine the coordinate positions. By this positioning, the tip positions relative to the device under test on software or the tester are corrected.

Thereafter, an electrical test of the device under test is conducted. At the time of the electrical test, the tip of each contact is pressed against the electrode of the integrated circuit. Thereby, an overdrive force acts on the contact, and the contact is curved by elastic deformation at the first and second arm portions.

In the aforementioned conventional contact, in order to reduce a reflected light from the underside of its pedestal portion entering the area sensor, the lower side of the pedestal portion is formed as two inclined faces inclined to an imaginary axis extending horizontally and located in the right-left direction.

However, if the angles of both inclined faces to the imaginary axis are made small, the amount of light reflected from both inclined faces and entering the area sensor is increased, and it becomes difficult to accurately obtain the tip position relative to the device under test or the tester. As a result, it becomes impossible to accurately determine the tip position relative to the electrode of the device under test or the tester.

Unless the tip position can be accurately determined as mentioned above, accurate positioning of the tester or the device under test and the contact is not possible, and the tip of the contact cannot be pressed against the electrode of a predetermined device under test, so that it is not possible to conduct a correct electrical test.

If the angles of both inclined faces to the imaginary axis are increased (i.e., the angles formed between both inclined faces are made acute), the area of a joint portion of the pedestal portion and the contact portion is decreased, and the bond strength of the contact portion relative to the pedestal portion becomes insufficient, which might cause the contact portion to come off or break when an overdrive force acts on the contact acts.

Another contact is shaped like a pin with the lower end portion formed like a truncated conical shape (Patent Literature 2). As this contact cannot be produced by a photolithography technology, the production cost becomes expensive, and when an overdrive force acts on the contact, an elastic body such as a spring member to be elastically deformed like the arm region of the contact is required, so that not only the contact itself but also the structure of a support base plate supporting the contact becomes complicated.

Patent Literature 1: WO 2006/095441; Patent Literature 2: JP Patent Appln. DP No. 2002-5957

SUMMARY OF THE INVENTION

Technical Problem

An object of the present invention is to enable to determine a tip position accurately without lowering mechanical strength of a contact portion.

Solution to Problem

The contact according to the present invention comprises a contact body provided with at least an arm region extending in the right-left direction and a tip region extending downward from the front end portion of the arm region. The tip region includes a pedestal portion integrally continuous to the lower edge portion on the front end side of the arm region, and a contact portion having a tip which is projected downward from the lower end portion of the pedestal portion and brought into contact with the electrode of the device under test at the lower end. The pedestal portion has at least four inclined faces positioned around the contact portion when the tip region is seen from below, and inclined such that the portions nearer the contact portion becomes downward The pedestal portion may have a plate-like shape having a thickness direction which is the front-back direction orthogonal to the right-left and vertical directions. The pedestal portion may be further extended in the longitudinal direction of the arm region.

The aforementioned at least four inclined faces can include, relative to the contact portion, an inclined face located on one side in the right-left direction, an inclined face located on the other side in the right-left direction, an inclined face located on one side in the front-back direction, and an inclined face inclined on the other side in the front-back direction.

The contact portion can include four faces located about an imaginary axis extending up-down direction through the center of the contact portion when the tip region is seen from below. Two faces among them can be located in the front-back direction relative to the axis and extend in the up-down direction, while the other two faces may be inclined so as to be located in the right-left direction relative to the axis, and inclined such that a portion on the axis side becomes lower.

Each of the four faces of the contact portion may be continuous to one of the four inclined faces of the pedestal portion.

The underside region is around the contact portion and includes at least six inclined faces respectively inclined such that a portion on the side of the contact portion becomes lower, and two inclined faces among them are located on one and the other sides, respectively, in the right-left direction relative to the contact portion, another two inclined faces are located on one side in the right-left direction relative to the contact portion, respectively, and the remaining two inclined faces are located on the other side in the right-left direction and may be located on one and the other sides in the front-back direction.

The contact body itself may be further provided with an extended region extending upward from the base end portion of the arm region, and a mounting region continuous to the upper end of the extended region. The contact portion may be made of a conductive material having a higher toughness than the pedestal portion.

The electrical connecting apparatus according to the present invention comprises a probe card including a plurality of contacts such as above.

The electrical connecting apparatus may further comprise: a chuck top which is on the underside of the probe card for receiving a device under test; an inspection stage which moves the chuck top at least two-dimensionally in the front-back direction and right-left direction; and an area sensor disposed in the inspection stage so as to film at least a contact portion of at least one electrical test contact.

In a method according to the present invention producing a contact, the contact comprises a contact body at least provided with an arm region extending in the right-left direction, and a tip region extending downward from the front end portion of the arm region, wherein the tip region is provided with a pedestal portion integrally continuous to the front end side of the arm region, and a contact portion projecting downward from the underside of the pedestal portion, the contact portion having a tip to be brought into contact with an electrode of the device under test.

The method of production comprises the following processes.

A first process to form a first photoresist having a first recess made by inclination exposure and development process, and forming a sacrificial layer imitating the surface of the contact portion within the first recess.

A second process to form the contact portion on the base member having a second recess within a second photoresist having a second recess and, after the first photoresist is removed, to form the contact portion within the second recess by depositing the first conductive material having a higher toughness than the pedestal portion within the second recess.

A third process to from the pedestal portion within the third recess after the second photoresist is removed, and to form a third photoresist having a third recess on the base member by inclination exposure and development process, and depositing a second conductive material having a higher toughness than that of the first conductive material.

A fourth process to form a fourth photoresist having a fourth recess on the base member after the third photoresist is removed, and to form the contact body within the fourth recess by depositing the second conductive material within the fourth recess.

Deposition of the conductive material in the recess in each process can be carried out by any one of electroplating, sputtering and vapor deposition.

Advantageous Effects of Invention

The aforementioned plurality of contacts are mounted on an adequate support base place such as a wiring board or a probe board like a cantilever by a bonding material such as solder or conductive adhesive, to be assembled into the electrical connecting apparatus. With the electrical connecting apparatus assembled into a tester, some contacts are illuminated from the tip side (the side of the device under test) and filmed from the tip side by an area sensor such as a CCD camera. The illumination light to the contacts reflects not only from the tips but also from the side faces of the contacts and the underside of the pedestal portions.

The contact portion itself is a projected portion from the lower end of the pedestal portion, and besides, the underside region of the pedestal portion has at least four inclined faces which are located around the contact portion, when the tip region is seen from below, and inclined such that a portion nearer the contact portion becomes lower, thereby bringing about the following advantages.

Since the surface around the contact portion is a surface inclined to a horizontal plane, the amount of reflected light is not reduced, but the amount of reflected light incident on the area sensor from the underside of the pedestal portion is remarkably reduced, and besides, there is no need to make the area of the joint portion of the pedestal portion and the contact portion small, so that the bonding strength of the contact portion with the pedestal portion is not lowered.

As a result, it is possible to determine accurately the coordinate position of the tip relative to the device under test or the tester.

If the pedestal portion is shaped like a plate whose front-back direction is the thickness direction, it is possible to make a pedestal portion with a complicated shape in which the underside region around the contact portion has at least four inclined faces by use of inclination exposure technique, thereby facilitating the production of the contact.

If the four inclined faces of the pedestal portion have an inclined face located on one side in the right-left direction, an inclined face located on the other side in the right-left direction, an inclined face on one side in the front-back direction orthogonal to the right-left and vertical directions, and an inclined face inclined toward the other side in the front-back direction, it is possible to easily produce the pedestal portion with a complicated shape by use of inclination exposure technique.

If the contact portion has at least four faces located therearound when the tip region is seen from below, and if the four faces include two faces extending in the vertical direction located in the front-back direction relative to an imaginary axis extending in the vertical direction through the center of the contact portion, and at least two inclined faces located in the right-left direction and inclined to the imaginary axis such that the portion on the side of the imaginary axis becomes lower, it is possible to easily and accurately produce the pedestal portion and the contact portion by using the inclination exposure technique, in spite of their complicated shapes.

If each of the four surfaces of the contact portion is continuous to one of the four inclined faces of the pedestal portion, the pedestal portion and the contact portion having a complicated shape can be more easily and more accurately produced by using the inclination exposure technique.

BRIEF DESCRIPTION OF DRAWINGS

FIG. 4 Views showing the front end portion of the contact: (A) a front elevation seeing the front end part of FIG. 3 from the direction of an arrow A; (B) a bottom view of (A); and (C) a view showing the right-side face of (B).

DESCRIPTION OF EMBODIMENTS

Definitions of Term

In the present invention, the direction vertical to the integrated circuit disposed in the chuck top is called up-down direction or vertical direction, the direction making the front end portion side and the direction making the base end portion side of the arm region of the contact respectively leftward and rightward is called right-left direction, and the direction orthogonal to the up-down direction and right-left direction (the thickness direction of the contact) is called front-back direction.

Those directions, however, are different, depending on the chuck top to receive the integrated circuit to be electrified. Thus, it is possible to use, for example, in a state that the up-down direction in the present invention is turned over, or made diagonal.

Embodiments of Electrical Connecting Apparatus and Contact

Figure 1:
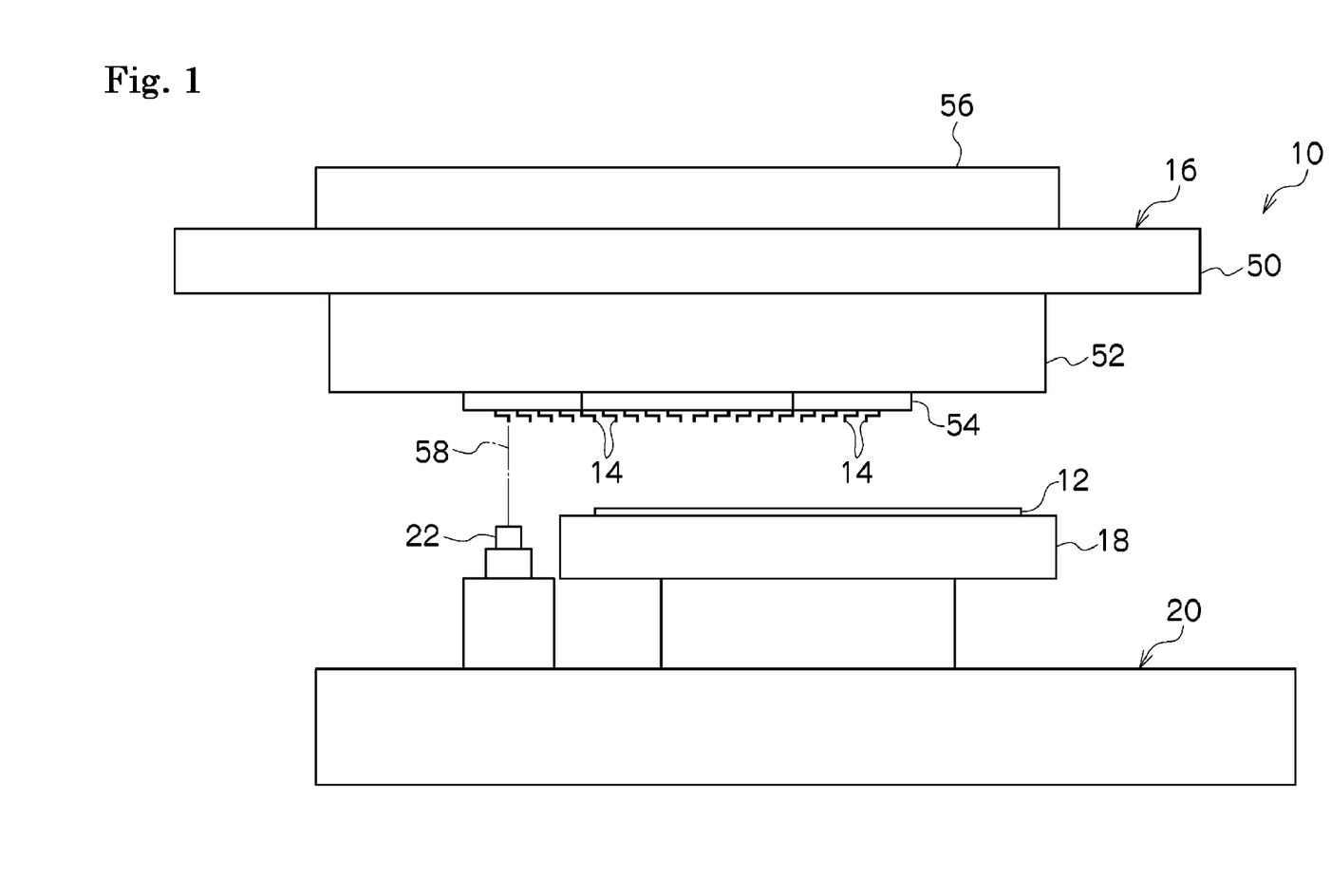
FIG. 1 A schematical view showing one embodiment of the electrical connecting apparatus according to the present invention.

Referring to FIG. 1, an electrical connecting apparatus 10 is used for electrically connecting electrodes of the circuits 12 and a tester in an electrical test to see whether or not a plurality of integrated circuits 12, that is, a testing apparatus as a flat plate-like device under test formed on a semi-conductive wafer are produced as per specification. The plural integrated circuits 12, in the illustration, is uncut ones formed on the semi-conductive wafer. In one electrical test using the electrical connecting apparatus 10, at least one integrated circuit 12 is tested.

The electrical connecting apparatus 10 comprises: a probe card 16 provided with a plurality of contacts 14 for electrical test; a chuck top 18 receiving integrated circuits on the upside; an inspection stage 20 for moving the chuck top 18 three-dimensionally at least in three directions, namely, front-back direction, right-left direction and up-down direction; and an area sensor 22 disposed on an inspection stage 20 so as to film at least one contact 14.

Figure 2:
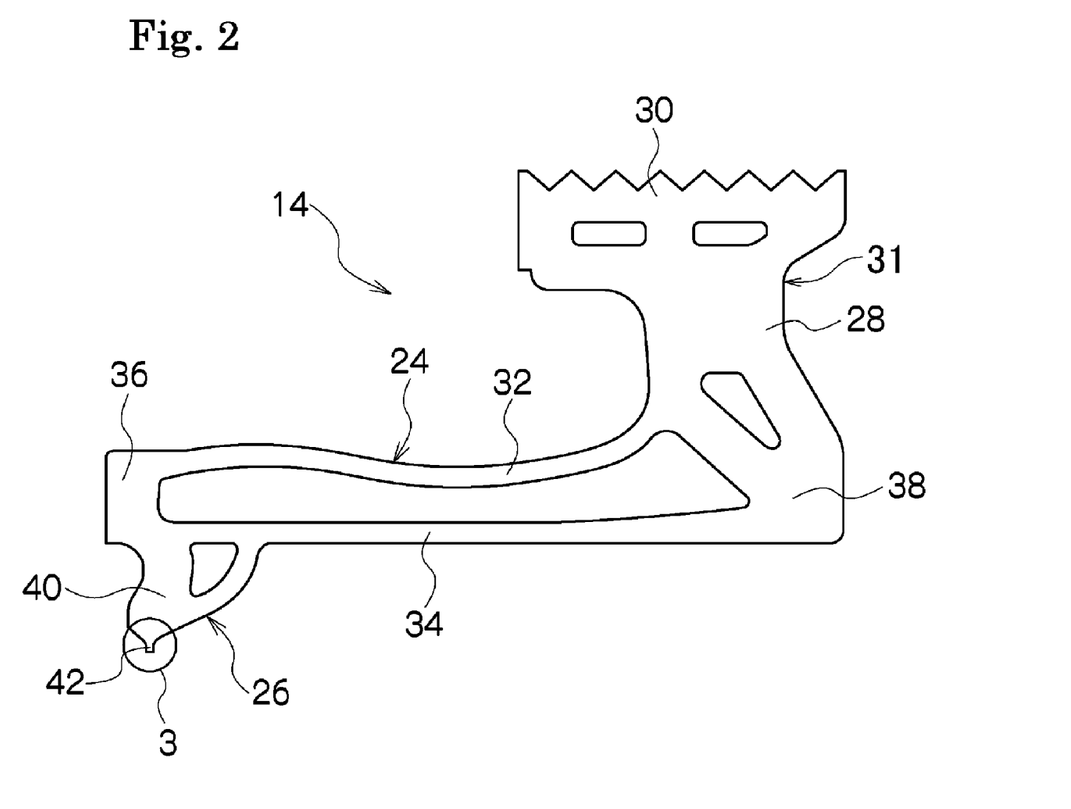
FIG. 2 A front elevation showing one embodiment of the contact according to the present invention.

As shown in FIG. 2, each contact 14 is formed into a plate-like crank shape by using photolithography technology, deposition technology and the like, and includes an arm region 24 extending in the right-left direction, a tip region 26 integrally continuous to the lower end edge on the front end side of the arm region 24, an extended region 28 extending upward from the rear-end portion of the arm region 24, and a mounting region 30 integrally continuous to the upper end of the extended region 28.

The extended region 28 forms a mounting portion 31 together with the mounting region 31. The arm region 24 extends from the lower end portion of the mounting portion 31 (actually, the extended region 28) to one side of the right-left direction, and forms a contact body together with the extended region 28 and the mounting region 30.

The arm region 24 is provided with a first and a second arm portions 32, 34 extending in the right-left direction at an interval in the up-down direction, and a first and a second coupling portions 36, 38 respectively coupling the first and second arm portions 32, 34 at their front end portions and rear end portions. The extended region 28 extends upward from the second coupling portion 38.

The tip region 26 is provided with a pedestal portion 40 which continues integrally to the lower edge portion of the front end side of the second arm portion 34 and the lower edge portion of the first coupling portion. At the lower end of the tip region 26 is integrally formed a flat tip 42a to be pressed against an electrode of the device under test.

Figure 4A:
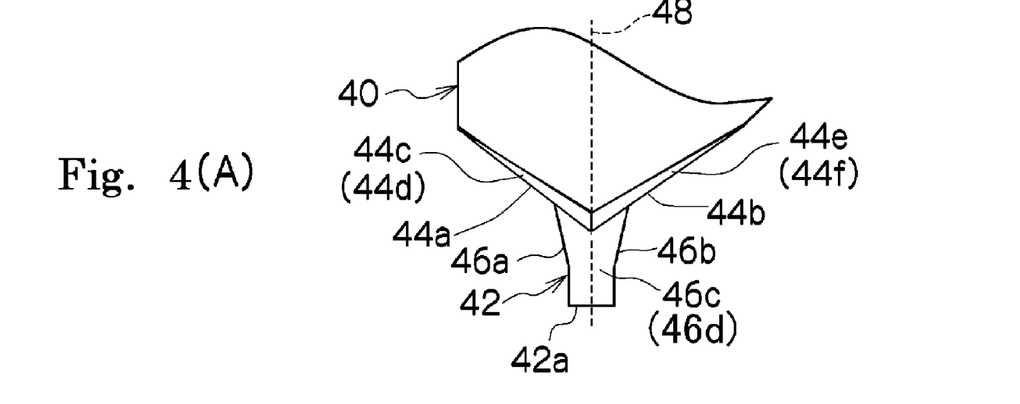
Figure 4B:
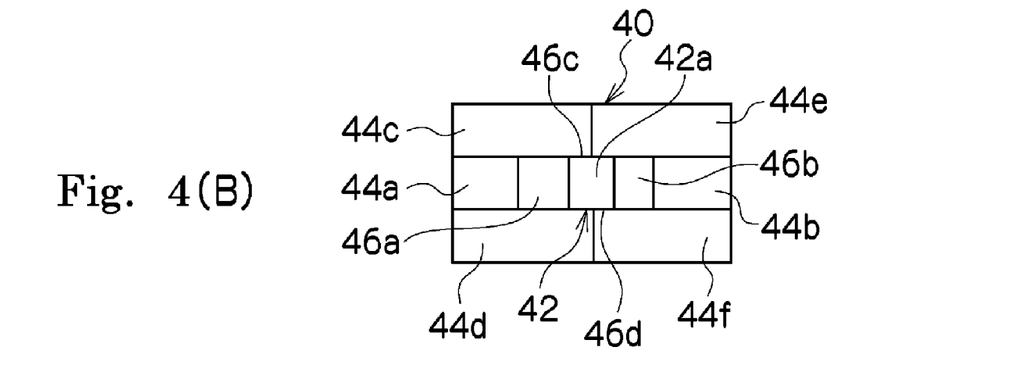
Figure 4C:
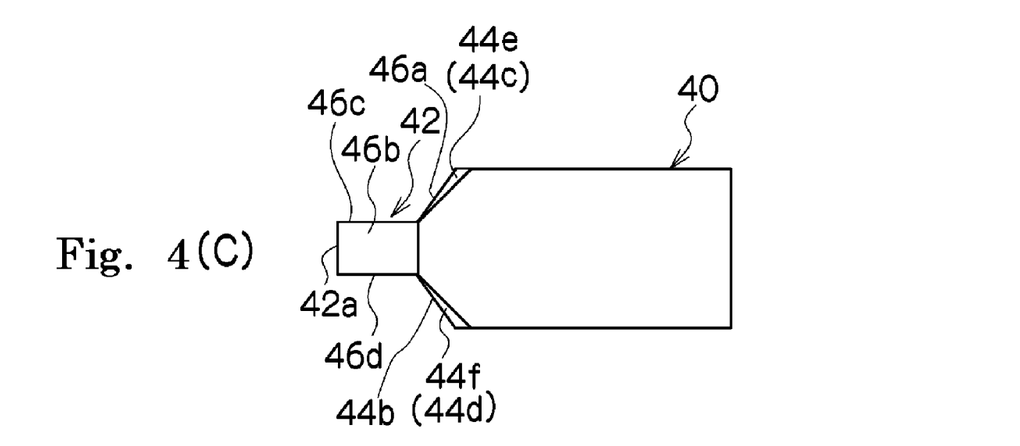

As shown in FIGS. 2 and 4, each contact 14 has a shape of a plate whose front-back direction is the thickness direction. Thus, the pedestal portion 40 extends orthogonally to the longitudinal direction of the arm region 24 and has a plate-like shape, whose front-back direction is the thickness direction, and the contact portion 42 has a plate-like shape, whose front-back direction is the thickness direction.

The first and second arm portions 32, 34, the first and second coupling portions 36, 38, the mounting region 30, the extended region 28, and the pedestal portion 40 of the tip region 26 which jointly form a contact body are formed like an integral plate having a substantially uniform thickness dimension in the front-back direction. The contact 14 is, therefore, has generally a flat plate-like shape.

The contact portion 42 is plate-shaped having a substantially uniform thickness dimension in the front-back direction. The thickness dimension of the contact portion 42 in the front-back direction is smaller than other portions in the same direction, particularly, the thickness dimension of the contact body.

Figure 3:
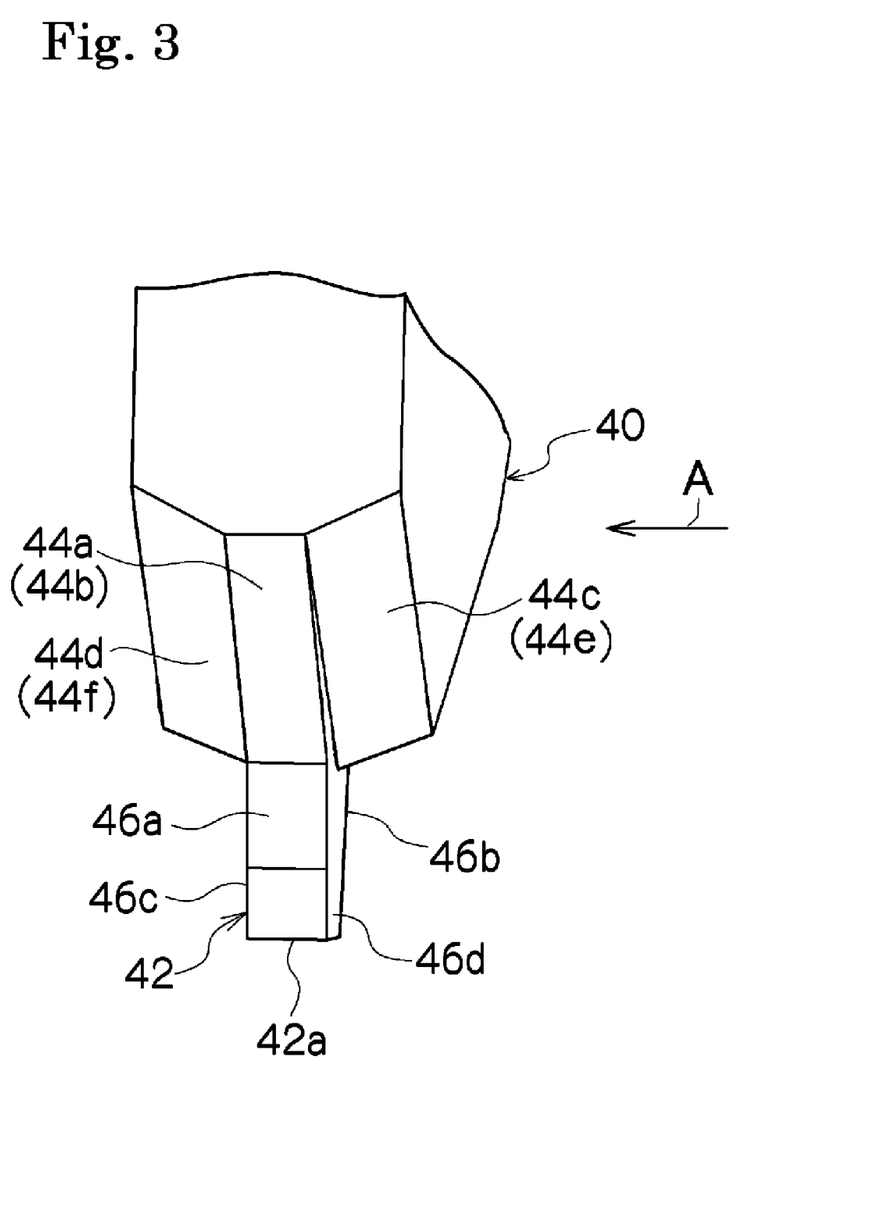
FIG. 3 An enlarged perspective view showing the front end portion 3 of the contact shown in FIG. 2.

As shown in FIGS. 3 and 4, when the tip region 26 is seen from below, the underside region around the contact portion 42 of the pedestal portion 40 has six inclined faces 44a, 44b, 44c, 44d, 44e and 44f. Each of the six inclined faces 44a, 44b, 44c, 44d, 443 and 44f is inclined to a horizontal plane (an imaginary axis 48 extending upward and downward through the center of the contact portion) such that the position toward the contact portion 42 is lower.

The two inclined faces 44a and 44b are respectively located on one side and the other side in the right-left direction relative to the contact portion 42. Another two inclined faces 44c and 44d are respectively located on one side in the right-left direction relative to the contact portion 42 and on one side and on the other side in the front-back direction. The remaining two inclined faces 44e and 44f are located on the other side in the right-left direction relative to the contact portion 42 and on one side and on the other side in the front-back direction.

The pedestal portion 40 and the contact portion 42 being plate-shaped, whose front-back direction is the thickness direction, the inclined faces 44a and 44b respectively located on one side and on the other side in the right-left direction relative to the contact portion 42 continue to either the faces 44c, 44d or the faces 44e, 44f in the right-left direction of the pedestal portion 40.

The illustrated example shows the faces 44a and 44b as inclined faces respectively facing lower leftward and lower rightward. On the other hand, the faces 44c and 44d are respectively inclined faces facing obliquely left forward and downward and obliquely left backward and downward, and the faces 44e and 44f are respectively the inclined faces facing obliquely right forward and downward and obliquely right backward and downward.

As shown in FIGS. 3 and 4, the contact portion 42 includes at least four faces 46a, 46b, 46c and 46d which, when the tip region 26 is seen from below, form an outer circumferential surface of the contact portion 42.

The two faces 46a and 46b are inclined faces inclined respectively located on the left side and right side relative to the axis 48 such that a portion nearer the axis 48 side becomes lower; in other words, inclined faces are inclined to the horizontal plane (axis 48) such that a portion on the lower side becomes the axis 48 side. The other two faces 46c and 46d are respectively vertical planes located forward and backward to the axis 48 and extending in the up-down direction.

The two faces 46a and 46b located in the right-left direction respectively continue to the two inclined faces 44a and 44b which only face rightward and leftward of the pedestal portion 40. On the other hand, the two faces 46c and 46d located in the front-back direction are respectively continue to the two inclined faces 44c, 44e located on one side and on the other side in the front-back direction of the pedestal portion 40 and the other two inclined faces 44d, 44f.

The contact portion 42 has a shape similar to an isosceles triangle when seen from the front-back direction. Thus, each of the faces 46a and 46b in the right-left direction of the contact portion 42 is inclined to the axis 48 such that the lower side portion approaches the side of the axis 48. On the other hand, the lower end face of the contact portion 42 is formed as a flat tip 42a orthogonal to the imaginary axis so as to be pressed against the electrode of the integrated circuit 12.

In the illustrated example, each pair of faces 44a and 44b, faces 44c and 44d, faces 44e and 44f, faces 44c and 44e, faces 44d and 44f, faces 46a and 46b, and faces 46c and 46d are formed symmetrically, but may be formed asymmetrically. In other words, those faces in a pair may have different angles to the horizontal plane and the axis 48.

As materials for the contact 14 can be enumerated conductive metal materials such as nickel-phosphorus alloy (Ni—P), nickel-tungsten alloy (Ni—W), rhodium (Rh), phosphor bronze (P—Sn—Cu), nickel (Ni), palladium-cobalt alloy (Pd—Co), and palladium-nickel-cobalt alloy (Pd—Ni—Co).

The contact 14 may be generally made of one of the above-mentioned materials. The contact 42, however, may be made of at least a different material from that of the pedestal 40, particularly, of a material having a higher toughness than that of the pedestal portion 40. In the latter case, the pedestal portion 40 may be made of the same material as that of both arm portions 32, 34, both coupling portions 36, 38, the mounting region 30 or the extended region 28, or of a different material.

In the illustrated example, the contact portion 42 is made of a material having a higher toughness than that of the pedestal portion. Thus, the contact portion 42 is maintained firmly on the pedestal portion 40 by a joint portion (not shown) made of the same conductive metal material as that of the contact portion 42. The joint portion is embedded with a part thereof exposed in one face in the front-back direction of the pedestal portion 40.

It will facilitate production of the contact 14 if the whole contact 14 is made of the same material, or the portions excluding the contact portion 42 are made of the same material.

It is also possible to produce the contact 14 such as above by repeating several times or more the exposure and development of a photoresist and deposition of conductive materials in a recess formed by the development.

Each contact 14 is cantilevered on a flat conductive portion formed on the underside of the probe card 16 on the upside of the mounting region 30 by a technique such as soldering.

As shown in FIG. 1, the probe card 16 includes a wiring board 50 made of an electrical insulating material such as glass-mixed epoxy, a ceramic board 52 attached to the underside of the wiring board 50, a probe board 54 attached to the underside of the ceramic board 52, and a reinforcing plate 56 attached to the upside of the wiring board 50.

The wiring board 50 and the ceramic board 52 have a plurality of mutually electrically connected internal wirings. The wiring board 50 also has a plurality of tester lands to be electrically connected to a tester not shown in the outer rim portion of the upside. Each tester land is electrically connected to the internal wiring of the wiring board 50.

The probe board 54 has not only a plurality of internal wirings electrically connected to the internal wirings of the ceramic board 52 in multi-layers but also on the underside a plurality of connection lands electrically connected in correspondence to the internal wirings thereof. Each contact 14 is mounted on the connection land.

The reinforcement plate 56 is made of a metal material such as stainless steel, and prevents flexure of the wiring board 50 in cooperation with the ceramic board 52.

The chuck top 18 adsorbs the integrated circuit 12 vacuum-wise and maintains it immovably. The inspection stage 20 is made as a three-dimensional moving mechanism for moving the chuck top 18 in three directions, that is, the front-back direction, right-left direction and up-down direction, and is provided with a θ-moving mechanism for moving the chuck top 18 angularly about an axis extending in the up-down direction.

As shown in FIG. 1, the area sensor 22 illuminates the tip 42a and its vicinity by focusing a light beam 58 to be oriented toward the tip 42a of a specific contact 14 to receive a reflected light from the tip 42a and its vicinity and convert it into an electrical signal. An output signal of the area sensor 22 is supplied to an image processor for determining the coordinate position of the specific contact 14.

In the illustrated example, an open angle of the beam 58 relative to an optical axis is smaller than the inclination angle of the inclined faces 44a, 44b, 44c, 44d, 44e and 44f to the horizontal plane. Such an open angle, however, may be the same as or greater than the inclination angle of the inclined faces 44a, 44b, 44c, 44d, 44e and 44f of the pedestal portion 40.

In the foregoing electrical connecting apparatus 10, the beam 58 irradiating the tip region 26 from below the contact 14 is reflected in the outer surface of the contact portion 42 and each inclined face of the pedestal portion 40.

In the electrical connecting apparatus 10, however, the tip 42a of the contact 14 is orthogonal to the axis 48, while the inclined faces 44a, 44b, 44c, 44d, 44e and 44f of the pedestal portion 40 are located about the axis 48 and inclined to be lower toward the contact portion 42, and the two faces 46a and 46b of the contact portion 42 extend in the up-down direction, and the other two faces 46c and 46d are inclined to be lower toward the axis 48 side.

Thus, the reflected light from the tip 42a progresses toward the area sensor 22, while the reflected lights from the inclined faces of the pedestal portion 40 and the other faces of the contact portion 42 do not progress toward the area sensor 22. As a result, the amount of the reflected light entering the area sensor 22 from the tip 42a is not reduced, but the amounts of the reflected lights entering the area sensor 22 from the inclined faces 44a, 44b, 44c, 44d, 44e and 44f of the pedestal portion 40 are remarkably reduced.

Also, it is not necessary to make small the area of the joint portion of the pedestal portion 40 and the contact portion 42, so that the joint strength of the contact portion 42 relative to the pedestal portion 40 is not lowered.

As a result, according to the electrical connecting apparatus 10, it is possible to accurately determine the coordinate position of the tip 42a relative to the device under test or the tester without lowering the mechanical strength of the contact portion 42.

The contact 14 such as above, of which the pedestal portion 40 and the contact portion 42 has a complicated structure, can be produced by use of inclination exposure technology as well as photolithography technology and deposition technique of conductive metal materials.

Embodiment of the Method of Producing the Contact

In the following is explained an embodiment of the method of producing the contact 14. FIGS. 5 through 8 are shown as sections with the contact 14 seen leftward along the axis 48 in FIG. 3.

Figure 5A:
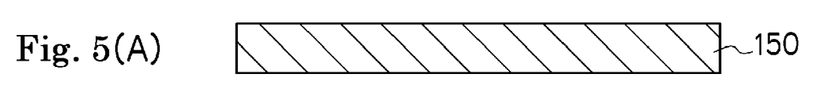
FIG. 5 A flow chart for explaining the method of producing the contact.

First, as shown in FIG. 5(A), nickel (Ni) and cupper (Cu) are sputtered on a surface of a plate-like stainless-steel base member 150 to form a thin release layer (not shown).

Figure 5B:
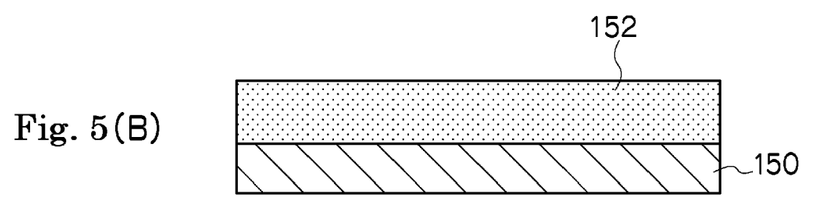

Next, as shown in FIG. 5(B), a photoresist 152 is coated like a layer on the base member 150 (actually, a release layer).

Figure 5C:
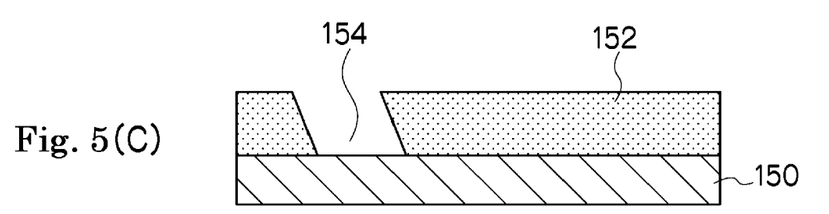

Then, as shown in FIG. 5(C), when the photoresist 152 in a masked state is exposed by so-called inclination exposure technology for applying a light obliquely, and thereafter developed. At that time, the light is applied obliquely from one side (the left side in the illustration) in the right-left direction relative to the base member 150. Thus, a recess 154 inclined on one side in the right-left direction relative to the base member 150 is formed in the photoresist 152.

Figure 5D:
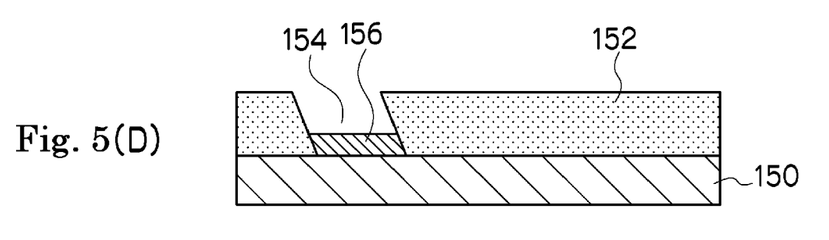

Then, as shown in FIG. 5(D), a sacrifice layer 156 with a predetermined thickness dimension is formed in the recess 154 by deposition technology such as electroplating, sputtering, vapor deposition or the like.

Figure 5E:
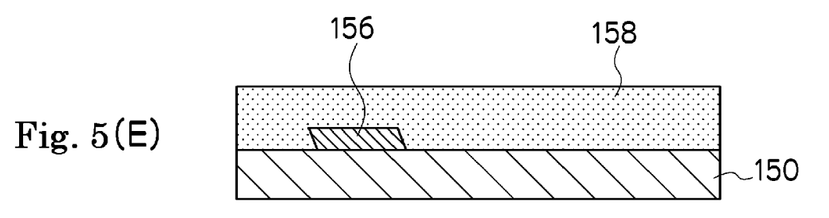

As shown in FIG. 5(E), after the photoresist 152 is removed, a photoresist 158 is coated like a layer on the base member 150 and the sacrifice layer 56.

Figure 5F:
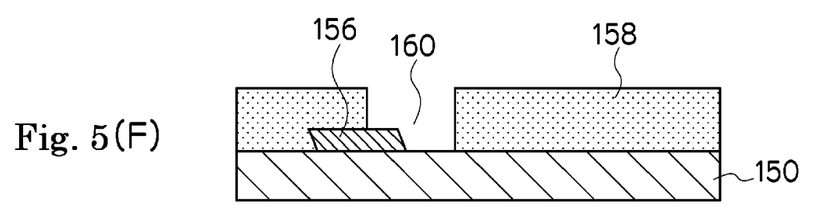

As shown in FIG. 5(F), the photoresist 158 in a state of being masked is exposed by a common exposure technology to apply a light perpendicularly and then developed. Thus, a recess 160 substantially perpendicular to the base member 150 is formed on the photoresist 158.

Figure 6A:
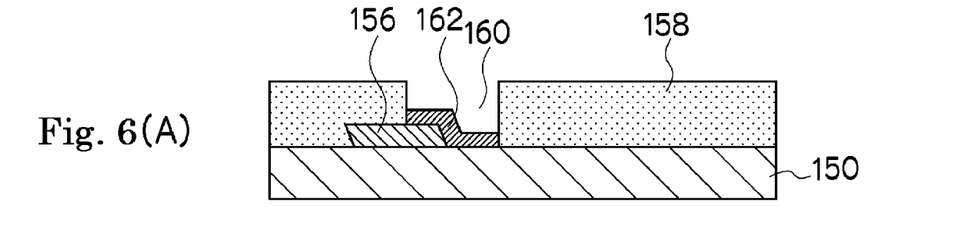
FIG. 6 A flow chart following FIG. 5 for explaining the method of producing the contact.

The recess 160, as shown in FIG. 6(A), is formed in the shape of a front end portion 162 of the contact 14. The front end portion 162 is a portion integral with a joint portion where it continues integrally to the contact portion 42 and joined with the pedestal portion 40.

Then, as shown in FIG. 6(A), the front end portion 162 is formed in the recess 160 by deposition technology such as electroplating, sputtering, vapor deposition or the like. The front end portion 162 is crank-shaped by use of a conductive metal material of high toughness such as rhodium, tungsten (W) or the like.

The surface on the left side in the center of the front end portion 162 is formed as an inclined face which retreats rightward toward the lower side and corresponds to the inclined faces 44c, 44d (or 44a, 44b) of the pedestal portion 40.

Figure 6B:
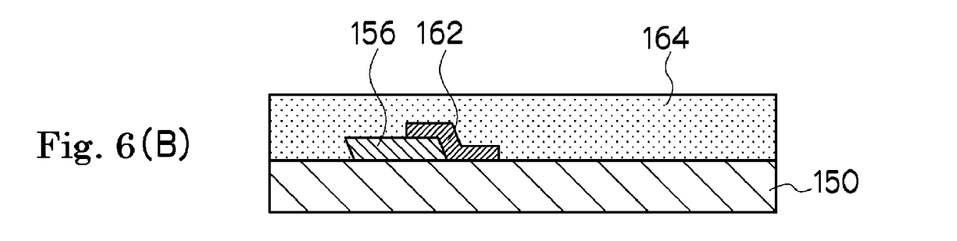

Then, as shown in FIG. 6(B), after the photoresist 158 is removed, a photoresist 164 is applied to form a layer on the base member 150, the sacrifice layer 156 and the front end portion 162.

Figure 6C:
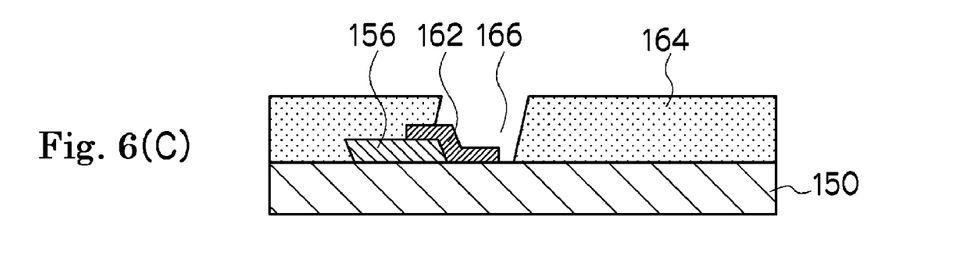

Then, as shown in FIG. 6(C), the photoresist 164 in a masked state is exposed by so-called inclination exposure technology and developed thereafter. The light is obliquely applied from the other side (rightward in the illustration) in the right-left direction relative to the base member 150, the sacrifice layer 156 and the front end portion 162. Thus, a recess 166 inclined toward the other side in the right-left direction relative to the base member 150, the sacrifice layer 156 and the front end portion 162 is formed in the photoresist 164.

Figure 6D:
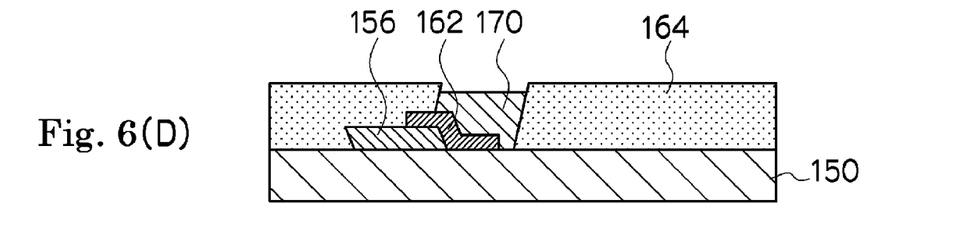

As shown in FIG. 6(D), a first body portion 170 acting at least as the pedestal portion 40 together with a part of the front end portion 162 is formed in the recess 166 by deposition technology such as electroplating, sputtering, vapor deposition or the like. The first body portion 170 is made of a conductive metal material having excellent toughness such as nickel-phosphorus alloy (Ni—P), tungsten alloy (Ni—W), rhodium (Rh), phosphor bronze (P—Sn—Cu), nickel (Ni), palladium-cobalt alloy (Pd—Co), palladium-nickel-cobalt alloy (Pd—Ni—Co) and the like.

The right-side face of the first body portion 170 is formed as an inclined face in which the upper side retreats rightward, and corresponds to the inclined faces 44a, 44b (or 44c, 44d) of the pedestal portion 40.

Figure 6E:
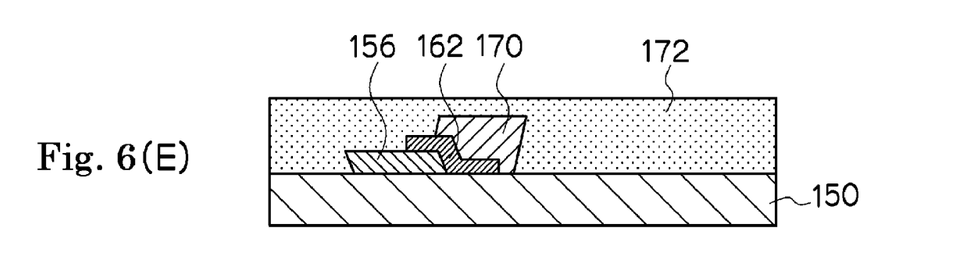

As shown in FIG. 6(E), after the photoresist 164 is removed, a photoresist 172 is coated like a layer on the base member 150, the sacrifice layer 156, the front end portion 162, and the first body portion 170.

Figure 7A:
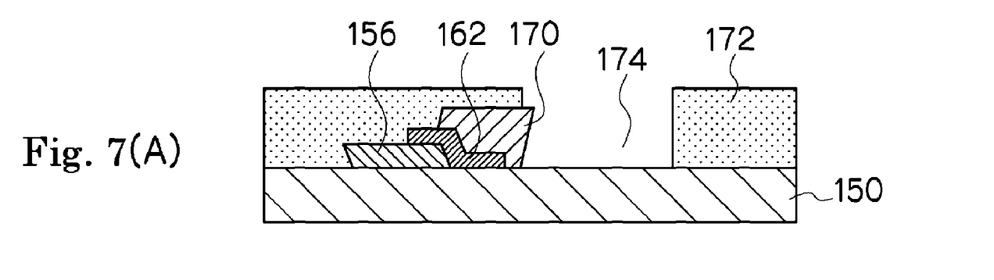
FIG. 7 A flow chart following FIG. 6 for explaining the method of producing the contact.

And, as shown in FIG. 7(A), the photoresist 172 is exposed by common exposure technology and developed thereafter. Thus, a recess 174 substantially perpendicular to the base member 150 is formed in the photoresist 172.

Figure 7B:
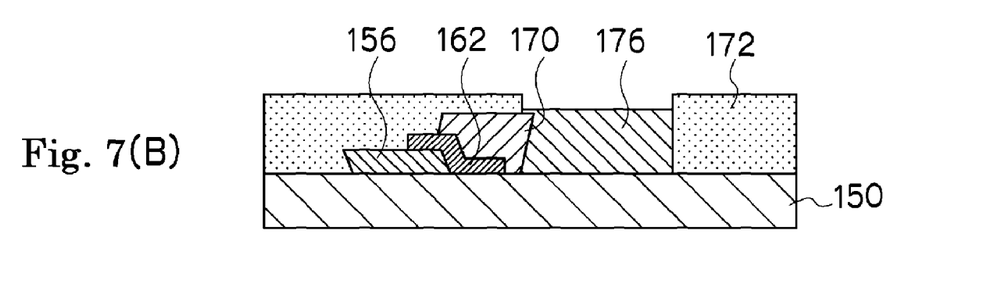

As shown in FIG. 7(B), a second body portion 176 acting at least as a contact body is formed in the recess 174 by deposition technology such as electroplating, sputtering, vapor deposition or the like. The second body portion 176 is made of a conductive metal material having excellent toughness like the first body portion 170.

Figure 7C:
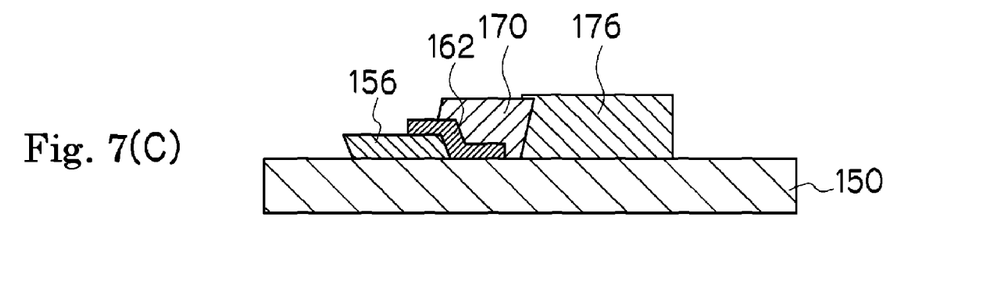

Thereafter, as shown in FIG. 7(C), the photoresist 172 is removed.

Figure 7D:
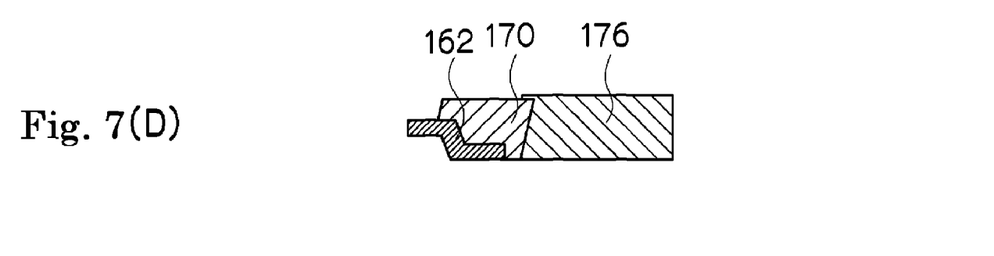

Then, as shown in FIG. 7(D), the sacrifice layer 156 is removed by etching, and the completed contact, i.e., the probe 14 is ripped off the base member 150.

As a result, as shown in FIGS. 3 and 4, the contact 14 can be obtained including the contact 14 having the six inclined faces 44a, 44b, 44c, 44d, 44e and 44f which are respectively located around the contact portion 42, when the tip region 26 is seen from below, and inclined downward toward the contact portion 42.

Controlling of a reflected light to the area sensor 22 differs, depending on the angle of each inclined face to the horizontal plane. Therefore, in the inclined exposure in the aforementioned process, the angle of the light to the horizontal plane is determined according to the amount of control of the reflected light to the area sensor.

As a result of experiments, a favorable effect of controlling the reflected light was obtained when an angle of incidence (angle of irradiation) of an exposed light relative to an exposed surface (the upside of the base member=horizontal plane) is 20° or more.

By utilizing the inclination exposure technology as mentioned above, a plurality of inclined faces inclined downward toward the side of the contact portion 42 can be formed in the pedestal portion 40. The contact 14 such as above, which controls a reflected light reflected on the underside at the pedestal portion and entering the area sensor 22, can detect only the reflected light from the tip 42a in the area sensor 22.

As a result, a tip position can be accurately detected. Also, there is no fear, as in the case of a conventional contact, that a coupling portion, i.e., the joint portion of the pedestal portion and the contact portion is narrowed and inhibits the toughness of the joint portion.

INDUSTRIAL APPLICABILITY

The contact 14 may be provided with a single arm region. In this case, it is possible to omit the coupling portions 36, 38 and form the tip region 26 on the front end side of the arm portion integrally therewith and form the extended region 28 integrally with the rear end side of the arm portion.

The number of the inclined faces to be provided on the underside of the pedestal portion 40 are not necessarily six but may be eight, ten, etc., if it is four or more.

Each of the inclined faces 44c, 44d and 44e, 44f may be formed as a single face like a face continuous as a small arc-shaped face of a small radius of curvature. In this case, the pedestal portion 40 has at least four inclined faces. In place of this, each of the inclined faces 44c, 44d, 44e and 44f may be formed with two faces which differ in angle of inclination relative to the horizontal plane.

The present invention can be used not only for an electrical test of an uncut integrated circuit formed in a semiconductor wafer but also for an electrical test of a cut integrated circuit.

The present invention is not limited to the foregoing embodiments but can be variously modified without departing from its purport.

What is claimed is:

1. A method of producing a contact for electrical test, said contact comprising a contact body having at least an arm region extending in the right-left direction, and a tip region extending downward from the front end portion of said arm region, wherein said tip region includes: a pedestal portion integrally continuous to the lower end portion on the front end side of said arm region; and a contact for electrical test projecting downward from the underside of said pedestal portion and having a contact portion with a tip to be brought into contact with an electrode of a device under test at a lower end, said method comprising:

a first process for forming on a base member a first photoresist having a first recess formed by inclination exposure and development and forming a sacrifice layer shaped like the surface of a contact portion of a contact within said first recess;

a second process for forming on said base member a second photoresist having a second recess after removing said first photoresist, and forming said contact portion by depositing within said second recess a first conductive material having higher toughness than said pedestal portion;

a third process for forming on said base member a third photoresist having a third recess formed by inclination exposure and development after removing said second photoresist, and depositing within said third recess a second conductive material having higher toughness than said first conductive material, thereby forming said pedestal portion within said third recess; and a fourth process for forming on said base member a fourth photoresist having a fourth recess after removing said third photoresist, and depositing said second conductive material within said fourth recess, thereby forming said contact body within said fourth recess.

2. The method of producing as defined in claim 1, wherein the deposition of the conductive material in each recess is performed by any one of electroplating, sputtering and vapor deposition.

* * * * *